(12) United States Patent
Halbig (10) Patent No.: US 9,722,333 B2
(45) Date of Patent: Aug. 1, 2017

(54) ELECTRONIC COMPONENT

(71) Applicant: MD ELEKTRONIK GmbH, Waldkraiburg (DE)

(72) Inventor: Thomas Halbig, Dorfen (DE)

(73) Assignee: MD ELEKTRONIK GMBH, Waldkraiburg (DE)

( * ) Notice: Subject to any disclaimer, the term of this patent is extended or adjusted under 35 U.S.C. 154(b) by 58 days.

(21) Appl. No.: 14/842,846

(22) Filed: Sep. 2, 2015

(65) Prior Publication Data

US 2016/0064838 A1 Mar. 3, 2016

(30) Foreign Application Priority Data

Sep. 3, 2014 (EP) .................................. 14003043

(51) Int. Cl.
| | |
|---|---|
| *H05K 7/00* | (2006.01) |
| *H01R 12/62* | (2011.01) |
| *H01R 9/03* | (2006.01) |
| *H01R 12/53* | (2011.01) |
| *H01R 12/58* | (2011.01) |
| *B60R 16/023* | (2006.01) |
| *H01R 4/02* | (2006.01) |
| *H01R 4/18* | (2006.01) |
| *H05K 3/34* | (2006.01) |

(52) U.S. Cl.
CPC .......... *H01R 12/62* (2013.01); *B60R 16/023* (2013.01); *H01R 4/02* (2013.01); *H01R 4/18* (2013.01); *H01R 9/034* (2013.01); *H01R 12/53* (2013.01); *H01R 12/58* (2013.01); *H01R 2201/26* (2013.01); *H05K 3/3447* (2013.01); *H05K 2201/09781* (2013.01); *H05K 2201/10189* (2013.01)

(58) Field of Classification Search
CPC .......... H01R 212/62; H01R 4/02; H01R 4/18; H01R 12/53; H01R 12/58; H05K 2201/09781; H05K 2201/10189
USPC .......................... 361/728–729, 807, 809, 810
See application file for complete search history.

(56) References Cited

U.S. PATENT DOCUMENTS 5,281,762 A * 1/1994 Long .................... H01R 9/0515
174/117 F
5,806,179 A 9/1998 Hassanzadeh
(Continued)

FOREIGN PATENT DOCUMENTS

FR 2923672 A1 5/2009
WO WO 2013132283 A1 9/2013

*Primary Examiner* — Hung S Bui
(74) *Attorney, Agent, or Firm* — Leydig, Voit & Mayer, Ltd.

(57) ABSTRACT

An electronic module includes a circuit board having three first holes arranged therein in a predetermined pattern, and a cable having at least three wires, a support clip and a body. The three wires are arranged around a longitudinal axis of the cable. The support clip has a fixing element arranged radially outside the wires. The wires are held by the fixing element in such a way that the support clip is fixed in a non-rotational manner relative to the wires. The cable is configured in such a way that the support clip is connected in a non-rotational manner to the body with respect to the longitudinal axis, and that a course of the wires is deflected by the body in such a way that the ends of the wires are positioned in the predetermined pattern. Conductors of the wires are disposed in the first holes.

17 Claims, 7 Drawing Sheets

(56) References Cited

U.S. PATENT DOCUMENTS

| | | | |
|---|---|---|---|
| 7,540,773 B2* | 6/2009 | Ko | H01R 13/5808 |
| | | | 439/581 |
| 2004/0055779 A1* | 3/2004 | Wiekhorst | H01B 7/0233 |
| | | | 174/117 AS |
| 2005/0263316 A1* | 12/2005 | Matsumoto | H02G 3/32 |
| | | | 174/113 R |
| 2006/0234556 A1 | 10/2006 | Wu | |
| 2009/0321761 A1 | 12/2009 | Wu et al. | |
| 2012/0061140 A1* | 3/2012 | Nonen | H01R 4/023 |
| | | | 174/84 C |
| 2012/0149238 A1 | 6/2012 | Negishi | |
| 2013/0269981 A1* | 10/2013 | Shiga | B60R 16/0215 |
| | | | 174/136 |

* cited by examiner

ELECTRONIC COMPONENT

CROSS-REFERENCE TO PRIOR APPLICATION

Priority is claimed to European Patent Application No. EP 14 003 043.8, filed on Sep. 3, 2014, the entire disclosure of which is hereby incorporated by reference herein.

FIELD

The invention relates to an electronic module comprising a circuit board and a cable, in particular a round cable, which is capable in particular of transmitting signals in vehicles.

The relevant modules can be used, for example, in motor vehicles or aircraft, and are generally required in large numbers. For providing modules of this type cost-effectively, a simple construction and the possibility of simple assembly and mounting are of great importance.

BACKGROUND

U.S. Pat. No. 5,806,179 discloses a round cable, the wires of which are placed in sequence linearly in a predetermined pattern using a planar plastics material body to simplify mounting on a circuit board.

SUMMARY

In an embodiment the present invention provides an electronic module which includes a circuit board having at least three first holes arranged therein in a predetermined pattern, and a cable having at least three wires, a support clip and a body. The at least three wires are arranged around a longitudinal axis of an end of the cable. Each of the wires includes an insulator and a conductor. The support clip has a fixing element arranged radially outside the wires. The wires are held by the fixing element in such a way that the support clip is fixed in a non-rotational manner relative to the wires. The cable is configured in such a way that the support clip is connected in a non-rotational manner to the body with respect to the longitudinal axis, and that a course of the wires is deflected by the body in such a way that the ends of the wires are positioned in the predetermined pattern. The conductors are disposed in the first holes and electrically contacted with the circuit board.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

In an embodiment, the invention provides an electronic module which is capable of transmitting signals or data and which can be manufactured at a comparatively low production cost.

According to an embodiment of the invention, the electronic module comprises a circuit board and a cable, wherein the circuit board has at least three first holes arranged in the circuit board in a predetermined pattern. In turn, the cable comprises at least three wires which are arranged around a longitudinal axis of the end of the cable and each comprise an insulator and a conductor. The cable further comprises a support clip, which in turn has a fixing element arranged radially outside the wires. The wires are held by the fixing element in such a way that the support clip is fixed in a non-rotational manner relative to the wires, or, in other words, in a manner that the support clip cannot rotate relative to the wires. In addition, the cable comprises what is known as a body. The cable is configured in such a way that the support clip in turn is also engaged in a non-rotational manner with the body (or, in other words, in a manner that the support clip cannot rotate relative to the body) with respect to the longitudinal axis, and that the course of the wires is deflected by the body in such a way that the ends of the wires are positioned in the predetermined pattern. The conductors are placed in the first holes and electrically contacted with the circuit board. In particular, the conductors are placed in the first holes in such a way that through-contact is provided, in other words the conductors are pushed through the first holes.

The cable thus comprises a plurality of wires which are arranged around a longitudinal axis of the end of the cable, in such a way that the cable can also be referred to in particular as a round cable, in which the wires can be arranged bundled in a circle in a round jacket, which may also be formed as an insulating tube (as opposed to a flat ribbon cable, in which the wires are arranged linearly side by side).

The predetermined pattern in which the ends of the wires are positioned deviates from a linear pattern. The ends of the wires thus span a geometric surface area and are not arranged along a line.

The term longitudinal axis relates in particular to the end of the cable or the cable in a stretched form.

Specifically, as regards simple and optionally automatable mounting, it is advantageous for the wires to be fixed in a non-rotational manner by a single fixing element as a result of the disclosed arrangement. If attention is paid to the correct angular orientation with respect to the wires when the support clip is mounted, the conductors can be correctly joined to the circuit board in a simple manner.

It is advantageous for the longitudinal axis of the end of the cable to be oriented orthogonally or perpendicularly to the circuit board.

In a preferred variant, the cable comprises four wires, which are twisted together. In addition, the cable may also have a shield which comprises for example a shielding mesh. In particular, the cable may be constructed using a star quad design.

It is advantageous for the body to comprise first recesses, the wires being arranged in the first recesses. The first recesses are preferably oriented in parallel with the longitudinal axis, in other words extend parallel to the longitudinal axis. The first recesses may be configured in such a way that the wires are held in a positive fit, for example by an undercut, in the radial direction (by a holding force orthogonal to the longitudinal axis).

In a further embodiment of the invention, the body comprises a second recess in which the support clip is received in a non-rotational manner, in particular in a positive fit. The cable is thus configured in such a way that the wires are arranged at the correct angle relative to the support clip, and that additionally the cooperation of the second recess of the body with the support clip provides orientation at the correct angle between the wires and the support clip.

Advantageously, the body may be enclosed by a radially external sheath. The body may be mechanically connected to the sheath, for example by latching.

In addition, the sheath may be connected in a non-rotational manner to the support clip or, in other words, in a manner that the sheath cannot rotate relative to the support clip.

In an advantageous embodiment of the invention, the support clip has an end configured as a fork and the sheath has at least one slit, wherein the fork or a prong of the fork engages in the at least one slit. Preferably, the sheath has at least two slits, in which case the fork engages in the at least two slits, in other words prongs of the fork engage in the at least two slits.

It is advantageous for the electronic module to be configured in such a way that the wires are enclosed by the sheath, which is radially external to the wires.

Furthermore, the support clip may also be connected to the circuit board, for example by a solder connection or by an adhesive connection.

In an advantageous embodiment of the invention, the support clip comprises an end configured as a fork, which is placed in at least one second hole in the circuit board. Accordingly, the fork can be connected to the circuit board, for example by a solder connection, latching or an adhesive connection. In the case of latching, the fork may comprise a latch hook which cooperates with the second hole in the circuit board in such a way that the fork or the support clip is mechanically connected to the circuit board after mounting is complete.

Neither the first holes nor the second hole need necessarily be produced by drilling. In the following, the term hole refers to a depression or opening, it being possible to configure a hole of this type having a round cross-section but also in an angular or non-round manner.

In a preferred embodiment, each of the conductors is placed in one of the first holes respectively, wherein the circuit board has at least one second hole in which an end of the support clip is placed. In this case, the at least one second hole is outside the surface area spanned by the center-points of the first holes.

The circuit board comprises at least three first holes arranged in the circuit board in the predetermined pattern. The predetermined pattern deviates from a linear pattern. The first holes (or the center-points thereof) thus span a geometric surface area and are not arranged along a line.

In a further embodiment of the invention, the circuit board has four first holes arranged in the circuit board in the predetermined pattern. The predetermined pattern is configured in such a way that the four first holes are positioned on the corners of an (imaginary) square.

It is advantageous for the circuit board to have two second holes which are positioned outside the square and in which an end of the support clip is placed. The end may be configured as a fork, in such a way that the fork is placed in the two second holes, in other words two prongs of the fork are placed in the two second holes.

In an advantageous embodiment of the invention, the wires are compressed in a radial direction by the fixing element of the support clip. In particular, the fixing element may be configured as a crimp sheath, in such a way that, after crimping the wires, are compressed in the radial direction, in other words towards the longitudinal axis. The fixing element or the crimp sheath may be fixed to a jacket of the cable or to a shield of the cable. The fixing element may enclose the jacket of the cable or the shield by direct contact.

Further details and advantages of the cable according to embodiments of the invention can be seen from the following description of two exemplary embodiments with reference to the accompanying drawings.

Figure 1:
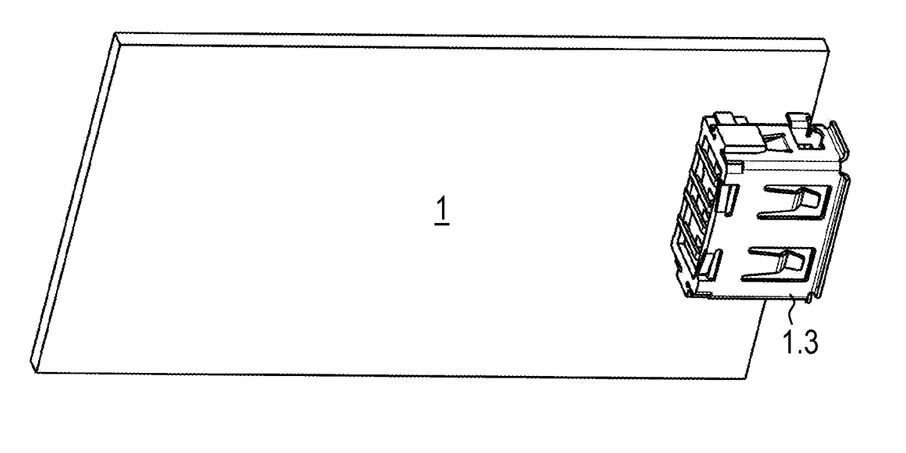
FIG. 1 is a perspective view of a circuit board before it is joined to a cable.

FIG. 1 is a perspective view of a circuit board 1 before the electronic module according to the invention has been assembled or mounted. The circuit board 1 comprises inter alia an electrical coupling part 1.3.

Figure 2:
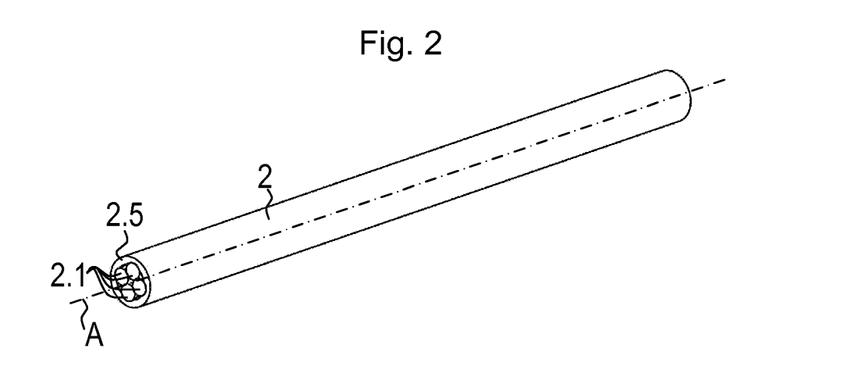
FIG. 2 is a perspective view of the cable before assembly.
Figure 3:
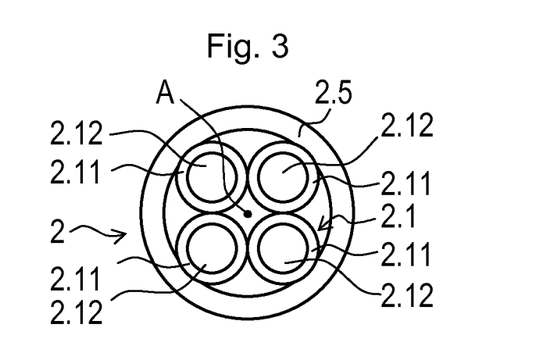
FIG. 3 is a front view of the cable.

FIG. 2 shows a cable 2 as it is provided at the start of the assembly process. The cable is configured as a round cable and, in the embodiment shown (see also the enlarged front view of FIG. 3), comprises four wires 2.1, which each comprise an internal conductor 2.12 and an insulator 2.11, each of the conductors 2.12 being enclosed by an insulator 2.11. The wires 2.1, which are arranged twisted helically around a longitudinal axis A, are enclosed by an insulating jacket 2.5 over the majority of the cable length. Furthermore, the wires 2.1 are optically coded, in such a way that reliable contact with the conductor 1 in the correct positions can be achieved. For this purpose, in the embodiment shown, the insulators 2.11 of the wires 2.1 are of different colours. In the embodiment shown here, the cable 2 is configured as an unshielded cable, it also being possible to use a shielded cable for the assembly according to the invention, such that a shield, for example in the form of a shield mesh, can then be provided radially outside the wires 2.1.

Figure 4:
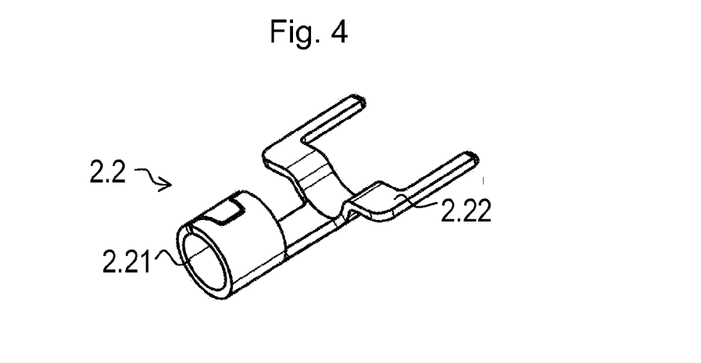
FIG. 4 is a perspective view of a support clip.

FIG. 4 is an enlarged view of a support clip 2.2, which in the embodiment shown is made from a tin-coated bronze material. In this drawing, the support clip 2.2 comprises a sheath-like fixing element 2.21 and a fork 2.22.

During assembly, the end of the cable 2 is initially freed from the jacket 2.5, in such a way that the internal wires 2.1 are exposed there.

Figure 5:
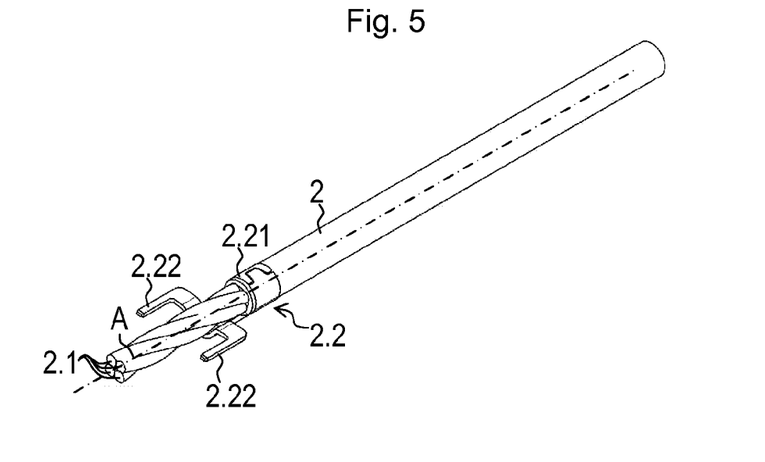
FIG. 5 is a perspective view of the cable comprising the support clip.

In a subsequent assembly step, the cable 2 is inserted into the support clip 2.2, in particular into the fixing element 2.21, until the fixing element 2.21 encloses the jacket 2.5. Subsequently, the support clip 2.2 is rotated manually or automatically about the longitudinal axis A relative to the wires 2.1, until a predetermined orientation or angular position of the wires 2.1 relative to the support clip 2.2 is achieved (for example by using the optical coding of the wires 2.1). For fixing in this position, the support clip 2.2, in particular the fixing element 2.21, is then pressed or crimped around the jacket 2.5, in such a way that the support clip 2.2 is rigidly mechanically connected to the jacket 2.5. Thus, the support clip 2.2 cannot be axially displaced or rotated relative to the wires 2.1. FIG. 5 shows the cable 2 having the support clip 2.2 fixed to the jacket 2.5.

Figure 6:
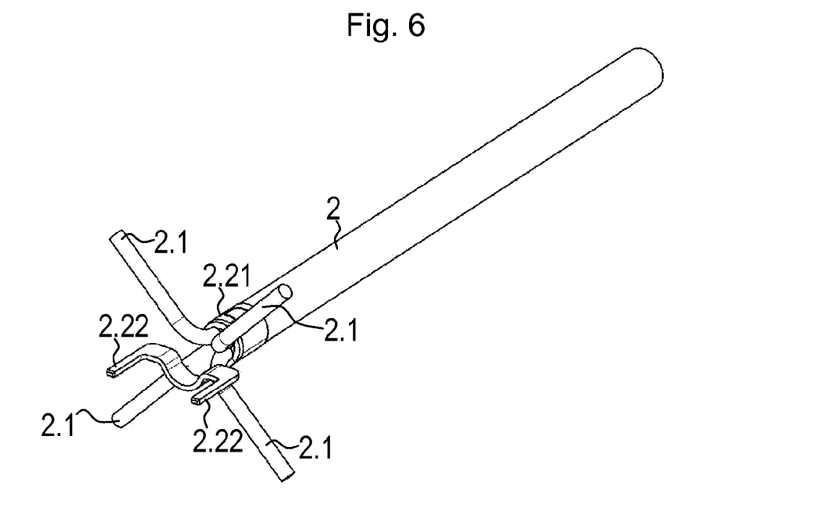
FIG. 6 is a perspective view of the cable comprising the support clip and having splayed wires.

Once the support clip 2.2 is correctly positioned and fixed relative to the wires 2.1, the wires 2.1 are spread radially outwards, or bent up, in such a way that the ends of the wires 2.1 are oriented in a direction having a radial direction component (FIG. 6).

Figure 7:
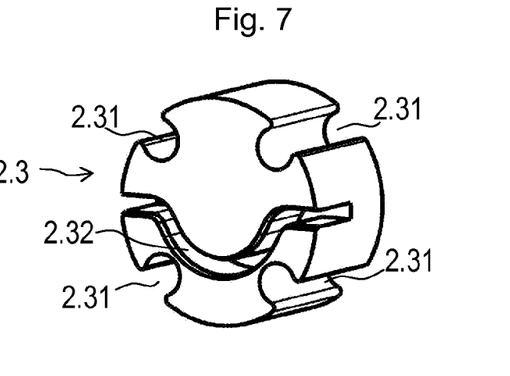
FIG. 7 is a perspective view of a body for deflecting the wires.

FIG. 7 shows a body 2.3 which, in the embodiment shown, is made of electrically insulating material, preferably of plastics material, by an injection-moulding method. Said body 2.3 comprises first recesses 2.31 and a second recess 2.32. The first recesses 2.31 each comprise an undercut, such that the respective first recess 2.31 is somewhat reduced or narrower radially outwardly by comparison with a region positioned radially further inward.

Figure 8:
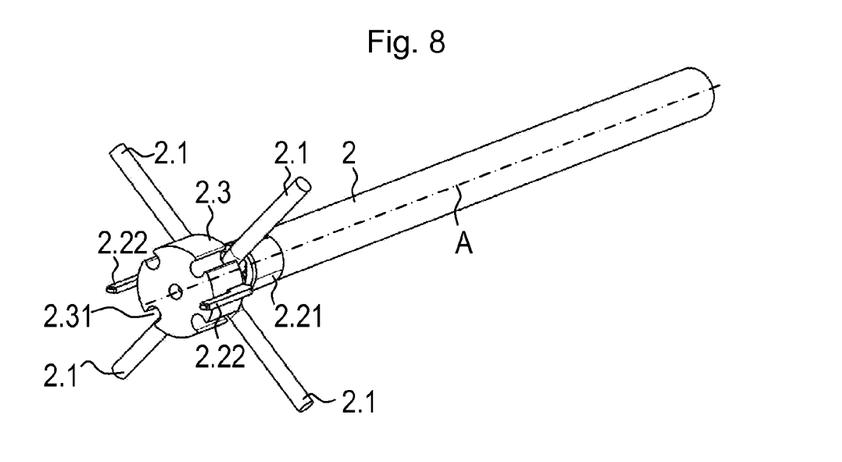
FIG. 8 is a perspective view of the cable comprising the body for deflecting the wires after a further assembly step.
Figure 9:
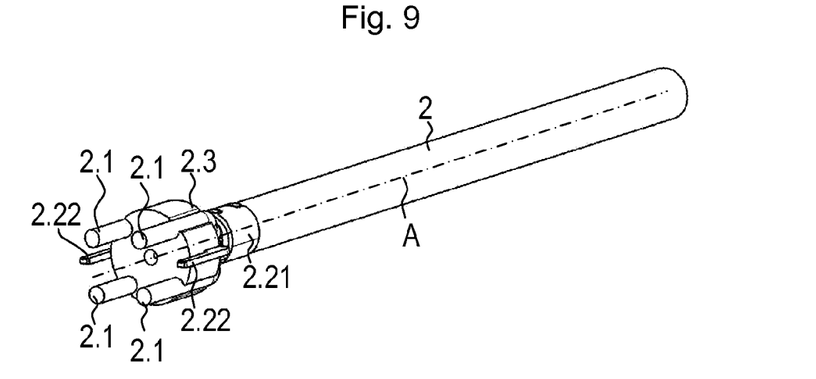
FIG. 9 is a perspective view of the cable comprising the body for deflecting the wires, which are located in recesses.

In a further step of assembling the cable 2, the body 2.3 is displaced parallel to the longitudinal axis A until the fork 2.22 of the support clip 2.2 is inserted into the second recess 2.32 (see FIGS. 8 and 9). Thus, a lock against rotation between the body 2.3 and the support clip 2.2, and thus also a lock against rotation between the body 2.3 and the wires 2.1, are produced by a positive fit.

Figure 10:
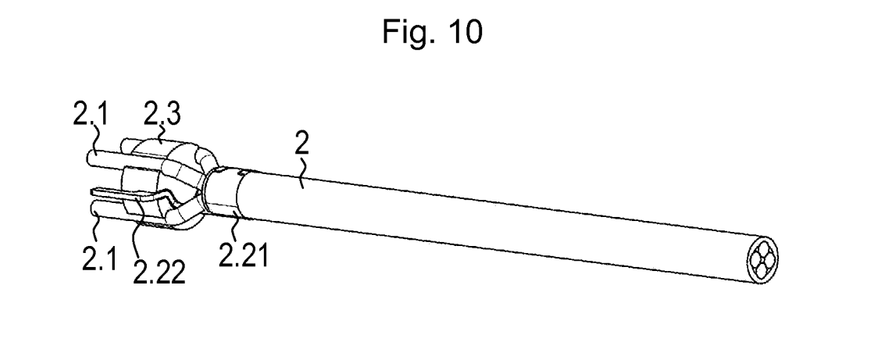
FIG. 10 is a further perspective view of the cable comprising the body for deflecting the wires after the assembly step of FIG. 8.

Subsequently, as shown in FIGS. 9 and 10, the wires 2.1 are pushed into the first recesses 2.31 which extend in parallel with the longitudinal direction A, the wires 2.1 latching into the body 2.3 through the undercuts in the first recesses 2.31, in such a way that resilient restoring forces in the wires 2.1 are absorbed and the wires 2.1 are each held in parallel with the longitudinal direction A. The extension of the wires 2.1 is thus deflected by the body 2.3 in such a way that the ends of the wires 2.1 are positioned in a predetermined pattern. The ends of the fork 2.22 extend past the body 2.3 in parallel with the ends of the wires 2.1.

Figure 11:
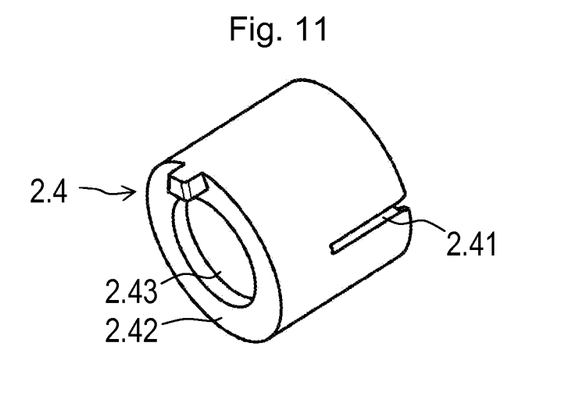
FIG. 11 is a perspective view of a sheath.

FIG. 11 shows a sheath 2.4, which comprises two slits 2.41 extending in an axial direction and a radially inwardly projecting base 2.42 which has a central hole 2.43.

Figure 12:
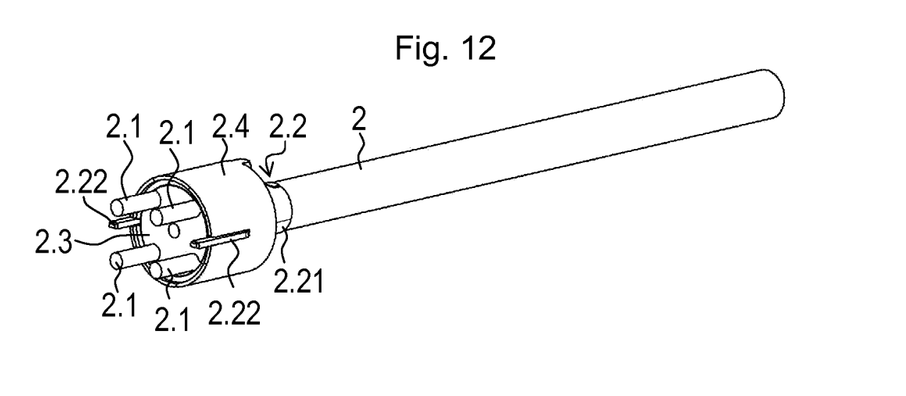
FIG. 12 is a perspective view of the cable comprising the sheath after a further assembly step.
Figure 13:
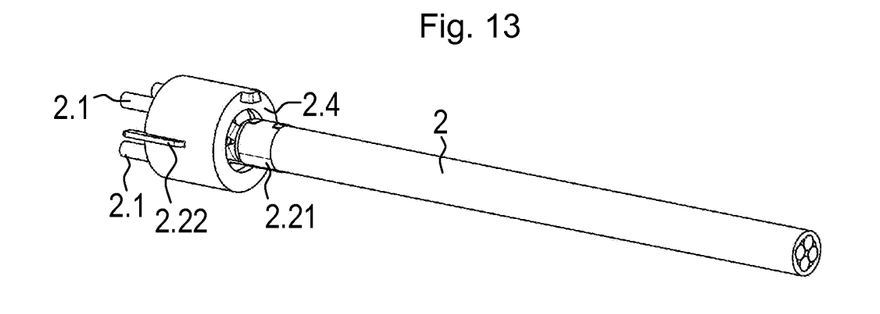
FIG. 13 is a perspective view of the cable comprising the sheath after the assembly step of FIG. 12.

The end of the cable 2 which has been removed from the support clip 2.2 is threaded into this hole 2.43, and the sheath 2.4 is moved in parallel with the longitudinal axis A in the direction of the support clip 2.2. The fork 2.22 is ultimately located in the slits 2.41, as is shown for example in FIGS. 12 and 13. The sheath 2.4 is thus mounted in a non-rotational manner with respect to the support clip 2.2 or with respect to the wires 2.1. By means of suitable dimensioning of the fork 2.22 and of the sleeve 2.4 or the slits 2.41 thereof, a press fit is achieved, in such a way that the sheath 2.4 is also secured against slipping axially relative to the support clip 2.2. Alternatively or in addition, plastics material may be overmoulded around the support clip 2.2 and the sheath 2.4, in such a way that the overmoulding not only has a sealing effect but can also absorb mechanical forces. By way of the mounted sheath 2.4, it can be ensured that the wires 2.1 remain in the position predetermined by the body 2.3 and in particular cannot escape radially from the first recesses 2.31.

Figure 14:
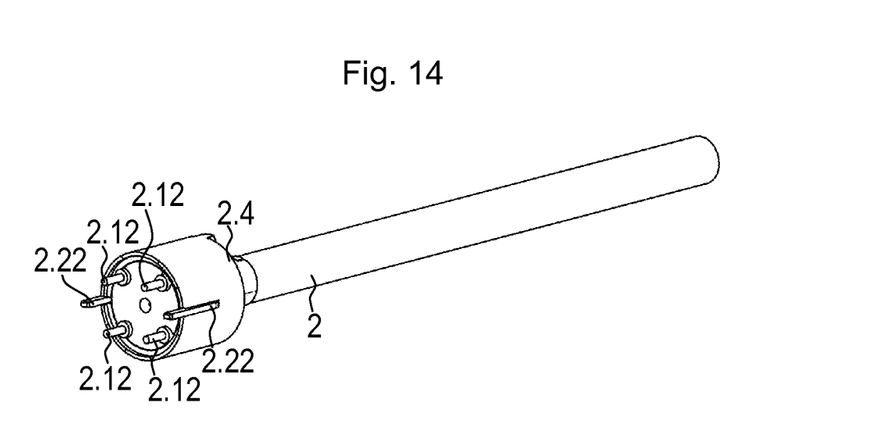
FIG. 14 is a perspective view of the cable having stripped ends of the wires.

Subsequently, the wires 2.1 are stripped, in other words the insulators 2.11 of the wires 2.1 are removed at the ends thereof, in such a way that the conductors 2.12 are exposed in these regions. FIG. 14 shows the cable 2 after this step.

Figure 15:
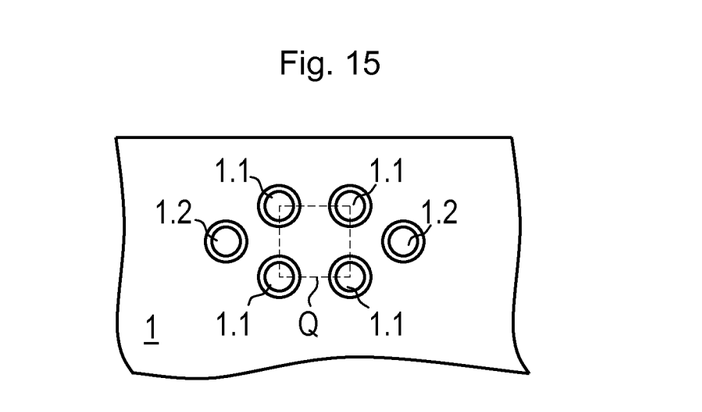
FIG. 15 is a detail of the circuit board comprising holes.

In a further step in the production of the electronic module, first holes 1.1 and two second holes 1.2 are formed in the circuit board 1 in a predetermined pattern, all of the holes 1.1, 1.2 passing through the circuit board.

The center-points of the first holes 1.1 span a surface area Q in the form of a square. The two second holes 1.2 are positioned outside the surface area Q spanned by the first holes 1.1. The first and second holes 1.1, 1.2 are metallised and strip conductors are applied to the circuit board 1.

Figure 16:
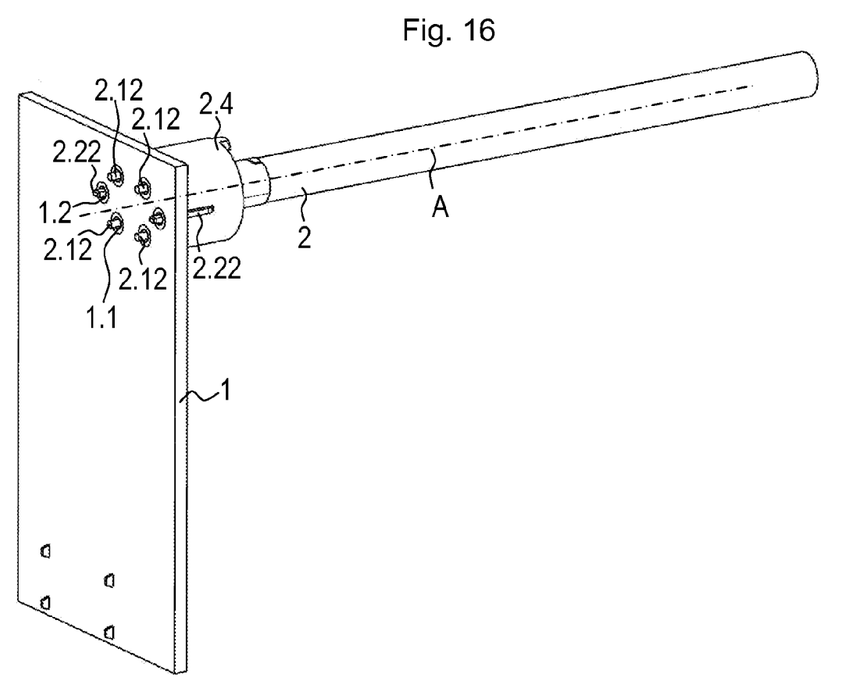
FIG. 16 is a perspective view of an electronic module.
Figure 17:
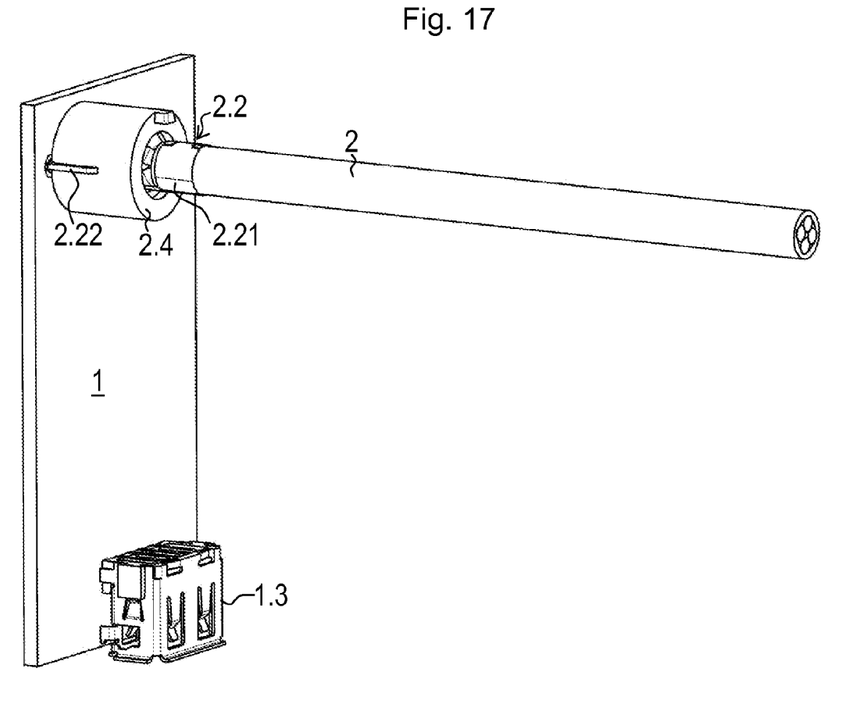
FIG. 17 is a further perspective view of the electronic module.

The circuit board 1 prepared in this manner is now joined to the cable 2, specifically in such a way that the four conductors 2.12 pass through the four first holes 1.1 in the circuit board 1. Furthermore, the ends of the fork 2.22 of the support clip 2.2 are received in the two second holes 1.2. In this context, the longitudinal axis A of the end of the cable 2 is oriented orthogonally to the plane of the circuit board 1. In this position, the ends of the fork 2.22 and those of the conductors 2.12 are now soldered to the circuit board 1. This results in an electronic module as shown in FIGS. 15 and 16, having through-contacted conductors 2.12.

Signals can now be transmitted between the coupling part 1.3 and the wires 2.1 via the strip conductors of the circuit board 1.

Figure 18:
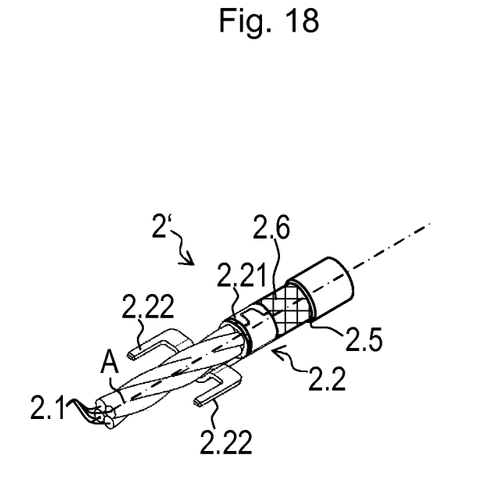
FIG. 18 is a perspective view of a cable in accordance with a second embodiment comprising the support clip.

FIG. 18 serves to illustrate a second embodiment. In this embodiment, a shielded cable 2' is used, which differs from the cable 2 of the first embodiment in particular in that a shield 2.6 is arranged between the jacket 2.5 and the wires 2.1. In a corresponding assembly step, the cable 2', which has had the jacket removed at the end, is inserted into the fixing element 2.21 until the fixing element 2.21 encloses the shield 2.6. Subsequently, the support clip 2.2 is rotated about the longitudinal axis A relative to the shield 2.6, in such a way that a predetermined orientation or angular position of the wires 2.1 relative to the support clip 2.2 is achieved. For fixing in this position, the fixing element 2.21 is subsequently pressed or crimped around the shield 2.6, in such a way that the support clip 2.2 is electrically contacted with and rigidly mechanically connected to the shield 2.6.

Thus, the support clip 2.2 cannot be axially displaced or rotated relative to the wires 2.1.

Otherwise, the electronic module can be assembled analogously to the first embodiment. The electrical potential of the shield 2.6 can thus be transmitted to the circuit board 1. Alternatively, in the second embodiment, the sheath 2.4 may be made of metal or metal-coated, in such a way that optimised shielding or electromagnetic screening can be achieved at this point. The shielded cable 2' is used for example for transmitting HF signals (high-frequency signals) in vehicles.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a"

or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An electronic module comprising:
a circuit board having at least three first holes arranged therein in a predetermined pattern; and
a cable having at least three wires, a support clip and a body, the at least three wires being arranged around a longitudinal axis of an end of the cable, each of the wires including an insulator and a conductor, the support clip having a fixing element arranged radially outside the wires, the wires being held by the fixing element in such a way that the support clip is fixed in a manner that the support clip cannot rotate relative to the wires, the cable being configured in such a way that the support clip is connected to the body in a manner that the support clip cannot rotate relative to the body with respect to the longitudinal axis, and that a course of the wires is deflected by the body in such a way that the ends of the wires are positioned in the predetermined pattern,
wherein the conductors are disposed in the first holes and electrically contacted with the circuit board, and
wherein the body comprises a second recess in which the support clip is received so as to prevent the support clip from rotating relative to the body.

2. The electronic module according to claim 1, wherein the longitudinal axis is oriented orthogonally to the circuit board.

3. The electronic module according to claim 1, wherein the body comprises first recesses and the wires are arranged in the first recesses.

4. The electronic module according to claim 1, wherein the body is enclosed by a radially external sheath.

5. The electronic module according to claim 4, wherein the sheath is connected to the support clip in a manner that the sheath cannot rotate relative to the support clip.

6. The electronic module according to claim 4, wherein the support clip has an end configured as a fork and the sheath has at least one slit, the fork engaging in the at least one slit.

7. The electronic module according to claim 4, wherein the wires are enclosed by the radially external sheath.

8. The electronic module according to claim 1, wherein the support clip is connected to the circuit board.

9. The electronic module according to claim 8, wherein the support clip is soldered to the circuit board.

10. The electronic module according to claim 1, wherein the support clip has an end configured as a fork which is disposed in at least one second hole in the circuit board.

11. The electronic module according to claim 1, wherein each of the conductors is disposed in one of the at least three first holes respectively and the circuit board has at least one second hole in which an end of the support clip is disposed, wherein the at least one second hole is outside of a surface area spanned by center-points of the first holes.

12. The electronic module according to claim 1, wherein the circuit board has four first holes arranged in the circuit board in the predetermined pattern, the four first holes being positioned on corners of a square.

13. The electronic module according to claim 1, wherein the wires are compressed in a radial direction by the fixing element.

14. The electronic module according to claim 1, wherein the fixing element is fixed to a jacket of the cable or to a shield of the cable.

15. An electronic module comprising:
a circuit board having at least three first holes arranged therein in a predetermined pattern; and
a cable having at least three wires, a support clip and a body, the at least three wires being arranged around a longitudinal axis of an end of the cable, each of the wires including an insulator and a conductor, the support clip having a fixing element arranged radially outside the wires, the wires being held by the fixing element in such a way that the support clip is fixed in a manner that the support clip cannot rotate relative to the wires, the cable being configured in such a way that the support clip is connected to the body in a manner that the support clip cannot rotate relative to the body with respect to the longitudinal axis, and that a course of the wires is deflected by the body in such a way that the ends of the wires are positioned in the predetermined pattern,
wherein the conductors are disposed in the first holes and electrically contacted with the circuit board,
wherein the body is enclosed by a radially external sheath, and
wherein the support clip has an end configured as a fork and the sheath has at least one slit, the fork engaging in the at least one slit.

16. An electronic module comprising:
a circuit board having at least three first holes arranged therein in a predetermined pattern; and
a cable having at least three wires, a support clip and a body, the at least three wires being arranged around a longitudinal axis of an end of the cable, each of the wires including an insulator and a conductor, the support clip having a fixing element arranged radially outside the wires, the wires being held by the fixing element in such a way that the support clip is fixed in a manner that the support clip cannot rotate relative to the wires, the cable being configured in such a way that the support clip is connected to the body in a manner that the support clip cannot rotate relative to the body with respect to the longitudinal axis, and that a course of the wires is deflected by the body in such a way that the ends of the wires are positioned in the predetermined pattern,
wherein the conductors are disposed in the first holes and electrically contacted with the circuit board, and
wherein the support clip has an end configured as a fork which is disposed in at least one second hole in the circuit board.

17. An electronic module comprising:
a circuit board having at least three first holes arranged therein in a predetermined pattern; and
a cable having at least three wires, a support clip and a body, the at least three wires being arranged around a longitudinal axis of an end of the cable, each of the wires including an insulator and a conductor, the support clip having a fixing element arranged radially outside the wires, the wires being held by the fixing element in such a way that the support clip is fixed in a manner that the support clip cannot rotate relative to the wires, the cable being configured in such a way that the support clip is connected to the body in a manner that the support clip cannot rotate relative to the body with respect to the longitudinal axis, and that a course of the wires is deflected by the body in such a way that the ends of the wires are positioned in the predetermined pattern, wherein the conductors are disposed in the first holes and electrically contacted with the circuit board, and wherein each of the conductors is disposed in one of the at least three first holes respectively and the circuit board has at least one second hole in which an end of the support clip is disposed, wherein the at least one second hole is outside of a surface area spanned by center-points of the first holes.

* * * * *